United States Patent
Trzasko et al.

(10) Patent No.: US 10,302,731 B2
(45) Date of Patent: May 28, 2019

(54) INTEGRATED IMAGE RECONSTRUCTION AND GRADIENT NON-LINEARITY CORRECTION FOR MAGNETIC RESONANCE IMAGING

(71) Applicant: MAYO FOUNDATION FOR MEDICAL EDUCATION AND RESEARCH, Rochester, MN (US)

(72) Inventors: Joshua D. Trzasko, Rochester, MN (US); Matthew A. Bernstein, Rochester, MN (US); Shengzhen Tao, Rochester, MN (US)

(73) Assignee: MAYO FOUNDATION FOR MEDICAL EDUCATION AND RESEARCH, Rochester, MN (US)

( * ) Notice: Subject to any disclaimer, the term of this patent is extended or adjusted under 35 U.S.C. 154(b) by 102 days.

(21) Appl. No.: 15/305,443

(22) PCT Filed: Apr. 24, 2015

(86) PCT No.: PCT/US2015/027606
§ 371 (c)(1),
(2) Date: Oct. 20, 2016

(87) PCT Pub. No.: WO2015/164793
PCT Pub. Date: Oct. 29, 2015

(65) Prior Publication Data
US 2017/0038452 A1 Feb. 9, 2017

Related U.S. Application Data

(60) Provisional application No. 61/984,300, filed on Apr. 25, 2014.

(51) Int. Cl.
*G01R 33/48* (2006.01)
*G01R 33/58* (2006.01)
*G01R 33/565* (2006.01)

(52) U.S. Cl.
CPC ..... *G01R 33/56572* (2013.01); *G01R 33/482* (2013.01); *G01R 33/4824* (2013.01); *G01R 33/58* (2013.01)

(58) Field of Classification Search
CPC ............ G01R 33/56572; G01R 33/482; G01R 33/4824; G01R 33/58
See application file for complete search history.

(56) References Cited

U.S. PATENT DOCUMENTS

| 4,591,789 A | 5/1986 | Glover et al. |
|---|---|---|
| 8,320,646 B2 | 11/2012 | Hu et al. |

(Continued)

FOREIGN PATENT DOCUMENTS

JP 2013154141 A 8/2013

OTHER PUBLICATIONS

International Search Report and Written Opinion dated Aug. 7, 2015 for International Application No. PCT/US2015/027606.

(Continued)

*Primary Examiner* — Rodney A Bonnette
(74) *Attorney, Agent, or Firm* — Quarles & Brady LLP (57) ABSTRACT

A system and method for simultaneously reconstructing magnetic resonance images and correcting those imaged for gradient nonlinearity effects are provided. As opposed to conventional methods for gradient nonlinearity correction where distortion is corrected after image reconstruction is performed, the model-based method described here prospectively accounts for the effects of gradient nonlinearity during reconstruction. It is a discovery of the inventors that the method described here can reduce the blurring effect and resolution loss caused by conventional correction algorithms while achieving the same level of geometric correction.

12 Claims, 3 Drawing Sheets

(56) References Cited

U.S. PATENT DOCUMENTS

| | | |
|---|---|---|
| 2002/0093334 A1 | 7/2002 | Zhu |
| 2004/0140804 A1 | 7/2004 | Polzin et al. |
| 2009/0238430 A1 | 9/2009 | Haider et al. |
| 2013/0088230 A1 | 4/2013 | Eggers |

OTHER PUBLICATIONS

Doran et al. A complete distortion correction for MR images: I. Gradient warp correction., Phys. Med. Biol. 50 (2005) 1343-1361. [Retrieved Jun. 25, 2015]. Retrieved from internet: URL <http://personal.ph.surrey.ac.uk/~phs3d/pdf/PMB_distortion_correction1.pdf> entire document.

Fessler, J. Model-based image reconstruction for MRI. IEEE Sig. Proc. Mag., 27(4):81-9, Jul. 2010, [Retrieved Jun. 25, 2015]. Retrieved from internet: URL <http://web.eecs.umich.edu/~fessler/papers/files/jour/10/pre/fessler-10-mbi.pdf> entire document.

Lee et al. The type 3 nonuniform FFT and its applications. Journal of Computational Physics 206 (2005) 1-5. [Retrieved June. 25, 2015]. Retrieved from internet: URL <http://math.ewha.ac.kr/~jylee/Paper/jcp-206-1.pdf> entire document.

Greengard et al. Accelerating the Nonuniform Fast Fourier Transform. Society for Industrial and Applied Mathematics. SIAM Review. vol. 46. No. 3, pp. 443-454. [Retrieved Jun. 25, 2015]. Retrieved from internet: URL <http://www.math.nyu.edu/faculty/greengar/glee_nufit_sirev.pdf> entire document.

Gunter, et al., Measurement of MRI Scanner Performance with the ADNI Phantom, Med. Phys., 2009, 36(6):2193-2205.

Trzasko, et al., Integrated Image Reconstruction and Gradient Nonlinearity Correction, Proc. Intl. Soc. Mag. Reson. Med., 2014, 22:4847.

European Patent Office, Extended European Search Report, Application No. 15783076.1, dated Dec. 18, 2017, 9 pages.

INTEGRATED IMAGE RECONSTRUCTION AND GRADIENT NON-LINEARITY CORRECTION FOR MAGNETIC RESONANCE IMAGING

CROSS-REFERENCE TO RELATED APPLICATIONS

This application represents the U.S. National Stage of International Application No. PCT/US2015/027606, filed Apr. 24, 2015 which claims the benefit of U.S. Provisional Patent Application Ser. No. 61/984,300, filed Apr. 25, 2014, and entitled "INTEGRATED IMAGE RECONSTRUCTION AND GRADIENT NON-LINEARITY CORRECTION FOR MAGNETIC RESONANCE IMAGING."

STATEMENT REGARDING FEDERALLY SPONSORED RESEARCH

This invention was made with government support under EB010065 and EB017840 awarded by the National Institutes for Health. The government has certain rights in the invention.

BACKGROUND OF THE INVENTION

The field of the invention is systems and methods for magnetic resonance imaging ("MRI"). More particularly, the invention relates to systems and methods for reducing artifacts in MRI data.

Due to engineering limitations, the gradient fields used for spatial encoding in clinical magnetic resonance imaging ("MRI") are never truly linear over the imaging field-of-view ("FOV"). As standard MRI signal models presume gradient linearity, reconstructed images exhibit geometric distortion unless gradient deviations are properly accounted for. Given a priori knowledge of the gradient field, geometric distortion due to gradient nonlinearity is typically corrected via image-domain interpolation. Although this retrospective approach, commonly termed gradient distortion correction or "GradWarp," is straightforward, it does not explicitly account for the effects of finite sampling, undersampling, or noise, and may consequently degrade spatial resolution.

Although prospective correction has been considered in situations when gradients are intentionally distorted for encoding purposes, such as parallel imaging techniques using localized gradients ("PATLOC") this approach has not been considered for the more common scenario where ideally linear gradients are not performing as desired.

Hence, given the above, there is a need for systems and methods for accurate and efficient correction of gradient nonlinearity in magnetic resonance imaging.

SUMMARY OF THE INVENTION

The present invention overcomes the aforementioned drawbacks by providing systems and methods that implement an integrated image reconstruction and gradient nonlinearity correction technique for use in magnetic resonance imaging ("MRI"). For instance, the present disclosure introduces a prospective compensation approach that accounts for gradient nonlinearity during, rather than after, image reconstruction, thereby reducing the tradeoff between geometric accuracy and spatial resolution.

It is an aspect of the invention to provide a method for reconstructing an image of a subject while correcting for gradient nonlinearity effects using an MRI system. Magnetic resonance data acquired from a subject using the MRI system are provided, and at least one image of the subject is reconstructed from the magnetic resonance data. Particularly, the at least one image is reconstructed while correcting for errors associated with a gradient nonlinearity using a model-based estimation that incorporates the errors associated with the gradient nonlinearity, thereby simultaneously reconstructing the at least one image of the subject and correcting the at least one image for the errors associated with the gradient nonlinearity.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for systems and methods for correcting gradient nonlinearities during magnetic resonance image reconstruction. As opposed to conventional methods for gradient nonlinearity correction where distortion is corrected after image reconstruction is performed, the model-based method described here prospectively accounts for the effects of gradient nonlinearity during reconstruction. It is a discovery of the inventors that the method described here can reduce the blurring effect and resolution loss caused by conventional correction algorithms while achieving the same level of geometric correction.

Gradient nonlinearity correction is routinely performed in clinical MRI to eliminate geometric spatial distortions that arise from imperfect hardware performance, and any improvements to this process may offer widespread benefit. For instance, the ability of prospective gradient nonlinearity correction to preserve spatial resolution may be particularly beneficial for longitudinal MRI studies looking for subtle image changes, and in the design of novel scanner architectures based on fast but sensitive gradients systems.

Standard gradient nonlinearity correction processes require specific information about the gradient distortion fields. This information is typically proprietary and not available for general public use. Moreover, vendor-provided distortion information is generally specific only to the type of NM scanner, not individual machines, and so does not account for scanner-specific distortions due to hardware variations.

The system and method provided by the present disclosure include a technique that prospectively accounts for distortions due to gradient nonlinearity during, rather than after, image reconstruction. This approach lessens the tradeoff between geometric accuracy and spatial resolution inherent to retrospective correction strategies. In addition, the approach of the present disclosure readily integrates into existing MRI reconstruction strategies and may facilitate its adoption. Additional improvements may include reducing the computational cost of the added NUFFT operations.

In some embodiments, information about a gradient distortion field is provided from storage on a magnetic resonance imaging ("MRI") system, as described above. In some other embodiments the gradient distortion field can be estimated from phantom images or by using electromagnetic simulations.

In the presence of gradient nonlinearity, a measured MRI signal generated using an MRI system can be modeled as follows, $$g[k] = \int_\Omega f(x) e^{-j\omega[k]\Delta(x)} dx + n[k] \quad (1);$$

where $f$ is the continuous target signal, $x$ is the spatial position vector, $\Delta(x)$ is the spatial distortion function due to gradient nonlinearity, $\Omega$ is the field of excitation, $g[k]$ is the $k^{th}$ signal measurement at k-space position $\omega[k]$, and $n$ is complex Gaussian noise. In some embodiments, the spatial distortion function due to gradient nonlinearity is assumed to be a priori known; however, as will be described below, in some embodiments this function can be estimated from quality assurance, or other, phantoms.

The problem of reconstructing the continuous image function, $f(x)$, from a finite measurement vector, $g$, is intrinsically ill-posed without auxiliary assumptions about the target signal. Typically, a finite series representation of $f(x)$ is assumed. That is, $$f(x) \approx \sum_{i \in \Theta} u[i] b(x - r[i]); \quad (2)$$

where $b(x)$ is a continuous pixel basis function, $r[i]$ is a pixel position vector, and $u(i)$ is the corresponding display coefficient of the $i^{th}$ pixel. Assuming a Dirac delta pixel model where $b(x)=\delta(x)$, the forward signal model in Eqn. (1) gives, $$g[k] = \sum_{i \in \Theta} u[i] e^{-j\omega[k]\Delta(r[i])} + n[k]; \quad (3)$$

which can be expressed in the following affine algebraic form:

$$g = Au + n \quad (4);$$

where $A(k,i) = e^{-j\Omega[k]\Delta(r[i])}$ denotes the forward spatial encoding operator. For non-accelerated Cartesian imaging, the set of k-space samples lie on a discrete uniform grid. Although image pixels are also generally assumed to lie on a similar uniform grid, $r[i]$, the presence of the distortion field (i.e., when $\Delta(r[i]) \neq r[i]$ in Eqn. (4)) causes the image pixels to be displaced in the discrete forward model according $\Delta(r[i])$. Therefore, the nominal spatial grid of an image reconstructed under Eqn. (4) may actually be nonuniform.

Thus, in the presence of gradient nonlinearity, A is mapping from a non-uniform image space grid onto a uniform k-space grid for Cartesian MRI. In this instance, the forward operator can be efficiently implemented using a type-1 non-uniform fast Fourier transform ("NUFFT") operator, which can be defined as follows:

$$A = DF\Gamma \quad (5);$$

where $\Gamma$ is a matrix representing a convolution interpolation operation that maps the irregular image grid onto an oversampled uniform image grid; F is an oversampled Fourier transform operator, such as an oversampled discrete Fourier transform (which may be implemented via fast Fourier transform); and D is a pixelwise deapodization function that compensates for blurring induced by the convolutional kernel, $\Gamma$. For non-Cartesian sampling, the forward operator can be efficiently implemented using a type-III NUFFT operator.

In some embodiments, MRI data are acquired using multiple coils and receiver channels. With this configuration, the data can be undersampled (i.e., only a subset of the data normally obtained during a scan is collected) to reduce overall scan time. Letting K, C, and N denote the total numbers of k-space samples, receiver coils, and pixels in the reconstructed image, respectively, the signal model in Eqn. (4) can be generalized to the following:

$$G = \Phi A U + N \quad (6);$$

where G is a K×C measurement matrix, $\Phi$ is a K×N binary row selection matrix that indicates the subset of Fourier elements actually sampled during an exam, U is an N×C targeted underlying multichannel image set, and N is proper a K×C proper complex Gaussian noise matrix.

As one example, both fully sampled and undersampled MRI data can be reconstructed using a penalized regression algorithm, which seeks to produce the image most likely to have produced the set of noisy measurements while potentially also satisfying some other expected properties, such as sparsity. Because noise in MRI is Gaussian distributed, a penalized least squares regression of the following general form can often be used:

$$\{\hat{U}\} = \underset{U \in C^{N \times C}}{\operatorname{argmin}} \{\lambda P(U) + \|\Phi A U - G\|_F^2\}; \quad (7)$$

where $\|\cdot\|_F^2$ is the Frobenius norm of a matrix; $P(\cdot)$ is a regularization, or penalty, functional that promotes some desired property in the reconstructed image; and $\lambda \geq 0$ is a mixing parameter that controls the relative preference placed onto the penalty functional and the data fidelity term.

It is noted that Jacobian-based intensity correction is not an explicit part of this model, as its effect is implicitly accounted for in the forward signal model. Also, it is noted that Eqn. (7) prospectively accounts for the presence of data noise. For the special case of $\lambda=0$, Eqn. (7) provides the maximum likelihood estimate of U. Moreover, Tikhonov and locally low rank ("LLR") penalties can be included via specific definition of the penalty functional to provide robustness and stability when reconstructing undersampled datasets collected during accelerated scans.

Having described the general framework for integrating gradient nonlinearity correction into the image reconstruction process by utilizing an appropriately designed signal model, several examples of incorporating this model-based correction into different reconstruction techniques are now provided.

Example #1: Reconstruction for Fully Sampled Cartesian Acquisition

As one example, when Cartesian sampling is used with no undersampling ($\Phi=I$) or regularization ($\lambda=0$), Eqn. (7)

reduces to an ordinary least squares regression and has a simple closed form solution given by the following:

$$\{\hat{U}\} = \underset{U}{\operatorname{argmin}}(\|AU - G\|_F^2) = (A^*A)^{-1}A^*G; \quad (8)$$

which can be iteratively solved via standard or conjugate gradient descent. The inverse Gramian matrix, $(A^*A)^{-1}$, can be well approximated by a diagonal matrix constructed from the Jacobian determinant of the distortion field, J, which in turn provides a noniterative pathway for performing coil-by-coil gradient nonlinearity corrected reconstruction of fully sampled Cartesian MRI data, as follows:

$$\{\hat{U}\} = \{\hat{U}_{approx}\} = JA^*G \quad (9).$$

The approximate solver in Eqn. (9) is a noniterative method based on the signal model described above, and thus utilizes explicit oversampled interpolation and deapodization steps, which enables the later performance of coarse geometric distortion correction without introducing significant image blurring.

Example #2: Partial Fourier Homodyne Acquisition

As another example, gradient nonlinearity can be corrected for during reconstruction of data acquired using a partial Fourier homodyne acquisition. Partial Fourier accelerations are based on the assumption that the target signal is strictly real-valued, and that any spurious image phase is either a priori known or can be easily estimated from a low-frequency reference signal. Because the Fourier transform of a real-valued signal is conjugate symmetric, partial Fourier methods enable upwards of two-fold acceleration.

Assuming that the target signal is real-valued, the signal model in Eqn. (4) can be re-expressed as:

$$g = A\psi u_r + n \quad (10);$$

where the notation $u_r$ denotes that the target signal is real-valued. The diagonal matrix, $\psi$ (where $\psi_{i,j} = e^{j\theta i}$) represents the apparent image phase that may be due to receive $B_1$ field inhomogeneity, off-resonance, eddy current effects, or combinations thereof. As described below, this apparent image phase can be estimated from a fully-sampled, low-frequency region of k-space.

Standard partial Fourier methods construct method-of-moments estimates of $u_r$ from the measurements, g. Noting that the expected value of Eqn. (10) is $A\psi u_r$, the real-valued signal, $u_r$, can be estimated as, $$u_r = \operatorname{real}[\psi^*(A^*A)^{-1}A^*g] \quad (11);$$

where the ensemble average (i.e., the expected value) has been replaced with the sample average or observation vector. As described above, the operator $(A^*A)_{-1}$ can be approximated by a real-valued diagonal matrix, diag $\{J\}$, where J is the Jacobian determinant of the gradient nonlinearity-induced distortion field. Thus, Eqn. (11) can be rewritten as, $$u_r \approx \operatorname{real}\{\psi^* \operatorname{diag}\{J\} A^* g\} \quad (12).$$

Denoting $\Phi_L$ as the binary operator extracting the central, low-pass region of k-space, and denoting $\Phi_{H_1}$ and $\Phi_{H_2}$ as symmetrically extracting the high-pass regions above and below the center of k-space, respectively, then, the signal measurement vector can be split up along the phase encoding or readout direction as follows:

$$u_r \approx \operatorname{real}\{\psi^* \operatorname{diag}\{J\} A^* (\Phi_L + \Phi_{H_1} + \Phi_{H_2}) g\} \quad (13)$$

$$= \operatorname{real}\{\psi^* \operatorname{diag}\{J\} A^* (\Phi_L + 2\Phi_{H_1}) g\} +$$

$$\operatorname{real}\{\psi^* \operatorname{diag}\{J\} A^* (\Phi_{H_2} - \Phi_{H_1}) g\}.$$

Homodyne reconstruction recovers the real-valued image vector by assuming conjugate symmetry of k-space measurements, leading to, $$\operatorname{real}\{\psi^* \operatorname{diag}\{J\} A^* (\Phi_{H_2} - \Phi_{H_1}) g\} \approx 0 \quad (14);$$

hence, $u_r$ can be reconstructed by:

$$u_r \approx \operatorname{real}\{\psi^* \operatorname{diag}\{J\} A^* (\Phi_L + 2\Phi_{H_1}) g\} \quad (15).$$

Similar to its original counterpart, the homodyne reconstruction as in Eqn (15) is non-iterative.

In standard partial Fourier methods, the image phase estimate, $\psi$, is constructed from a fully-sampled low-frequency region of k-space. However, Eqn. (10) presumes that the phase map is inherently gradient nonlinearity distortion-free. As a result, the reference signal is preferably derived from a low-resolution image generated using the integrated gradient nonlinearity correction, such as by, $$\psi_{i,i} = e^{j\angle(\operatorname{diag}\{J\}A^*\psi Lg)_i} \quad (16);$$

where the $\angle(\bullet)$ operator returns the phase map of a complex vector.

Example #3: Grappa

In general, the integrated gradient nonlinearity and image reconstruction technique can be adapted for accelerated acquisitions, such as those implemented for parallel imaging techniques. In general, parallel imaging techniques exploit redundancies between data acquired using phased array receivers to reduce the amount of data required to generate an MR image.

As one example, the integrated gradient nonlinearity and image reconstruction technique can be adapted for GRAPPA-based acquisitions and reconstructions. GRAPPA is an auto-calibrating k-space based parallel imaging method that reconstructs a full set of coil images from undersampled k-space data.

Denoting G as the M×C multi-channel k-space data matrix, where M and C are the number of k-space measurements per coil and the number of coils, respectively, the forward signal model of GRAPPA is, $$G = AU + N \quad (17);$$

where U is the N×C matrix (where N denotes the total number of image pixels) representing the set of coil images and the matrix N is the N×C proper Gaussian noise matrix. For an accelerated acquisition, N≥M. Note that Eqn. (17) is a generalization of Eqn. (4), similar to Eqn. (6). Following auto-calibration, GRAPPA estimates missing k-space values using Fourier-domain interpolation. The N×C fully-sampled multi-coil k-space data matrix that is estimated by GRAPPA $\hat{G}$, can be denoted as, $$\hat{G} = H_{GRAPPA}\{G\} \quad (18);$$

where $H_{GRAPPA}\{\bullet\}$ is the k-space interpolation operator that is derived from auto-calibration signal ("ACS") data prior to image reconstruction.

Because GRAPPA reconstruction occurs entirely in k-space, integrated gradient nonlinearity correction does not need to be embedded within this process and can simply be performed while transforming the reconstruction result from k-space to the image domain in a way similar to the case of full k-space sampling, $$U = (A^*A)^{-1}A^*\hat{G} \approx \text{diag}\{J\}A^*\hat{G} \quad (19)$$

Again, the Jacobian determinant approximation is used. Similarly, if the target signal is presumed to be real-valued, homodyne techniques can also be incorporated into this reconstruction process to yield, $$u_c \approx \text{real}\{\psi^*_c \text{diag}\{J\}A^*(\Phi_L + 2\Phi_{H_1})g_c\} \quad (20);$$

where $u_c$, $g_c$, and $\psi_c$ denote the real-valued image, the GRAPPA reconstructed k-space signal, and the phase map of the $c^{th}$ coil, respectively.

As will be appreciated by those skilled in the art, while the above approach has been outlined for GRAPPA, including partial Fourier reconstruction, this approach can also be readily implemented for k-space or hybrid k-space/image auto-calibrating multi-channel reconstruction strategies other than GRAPPA.

Example #4: Sense

As another example, the integrated gradient nonlinearity and image reconstruction technique can be adapted for SENSE-based acquisitions and reconstructions. SENSE is another widely-used parallel imaging method for accelerated acquisitions. Whereas GRAPPA reconstructs coil images individually, SENSE reconstructs a single image from the measured multi-channel data set. Assuming uniform, Cartesian under-sampling, the k-space MR signal observed during a standard SENSE acquisition can be modeled as, $$g = (I \otimes \psi A)Su + n \quad (21);$$

where g is an MC×1 multi-coil k-space data vector, S is an NC×N block diagonal matrix that represents the true (i.e., distortion-free) sensitivity profiles of receive coils, $\psi$ is an M×N matrix representing a uniform under-sampling operator, u is the N×1 target image vector, and n is an MC×1 noise vector. Additionally, I denotes a C×C identity matrix and the "$\otimes$" operator is the Kronecker product.

SENSE reconstruction estimates the target image vector, u, by solving the following regularized least-squared estimation problem:

$$\underset{u}{\text{argmin}}\{\|g - (I \otimes \Phi A)Su\|_2^2 + \lambda\|u\|_2^2\}; \quad (22)$$

where the regularization parameter, $\lambda > 0$, stabilizes the matrix inversion process implicit to this problem. This problem can be solved iteratively (e.g., via conjugate gradient iteration); however, the computational efficiency of this approach may not be sufficient for routine clinical use, particularly considering that standard SENSE reconstruction (without integrated GNL correction) is non-iterative. Although CG iteration is widely used for solving quadratic estimation problems like Eqn. (22), there exist many viable alternative numerical strategies. One such alternative optimization strategy is alternating direction method-of-multipliers ("ADMM"), which breaks apart a compound optimization problem like Eqn. (22) into a series of relatively easier tasks.

In standard reconstruction and gradient nonlinearity correction techniques, a conventional SENSE reconstruction is first performed on the undersampled data after which image domain gradient nonlinearity correction is applied to the resultant image. To utilize the proposed integrated gradient nonlinearity correction in a direct manner, the uncorrected SENSE image result can instead be Fourier transformed back to k-space, and the standard integrated gradient nonlinearity correction process for fully-sampled data can be applied. This process actually corresponds to the first iteration of a particular ADMM routine for solving Eqn. (22), assuming a zero-valued initialization). Specifically, the initial standard SENSE reconstruction without gradient nonlinearity correction is performed as, $$v = [\hat{S}^*(I \otimes F^*\psi^**\psi F)\hat{S} + \mu I]^{-1}\hat{S}^*(I \otimes F^*\psi^*)g \quad (23);$$

where $\hat{S}$ represents the set of gradient nonlinearity-distorted (i.e., non-corrected) coil sensitivity profiles and F is the discrete Fourier transform ("DFT") operator. The parameter $\mu > 0$ is an independent ADMM optimization parameter which, in the context of Eqn. (22), stabilizes the SENSE inversion process in manner similar to the parameter $\lambda$. The subsequent transform and gradient nonlinearity correction process is then, $$u = \alpha(\lambda)\text{diag}\{J\}A^*Fv \quad (24);$$

where $\alpha$ is an optional normalization constant that is a function of $\lambda$. Executing just a single iteration of the ADMM scheme for Eqn. (22) leads to improvements in spatial resolution relative to the standard SENSE reconstruction and gradient nonlinearity correction pipeline. For many practical applications, it is contemplated that this simple non-iterative routine will provide sufficient benefits. If further gains in performance are desired, additional iterations of the ADMM procedure can be executed, or an iterative conjugate gradient algorithm can be executed.

Like GRAPPA the homodyne strategy can also be integrated into SENSE reconstruction algorithm to enable additional acceleration. This process mirrors Eqn. (15), using the gradient nonlinearity-corrected SENSE reconstruction process in Eqn. (24) (which is denoted below in Eqn. (25) as $H_{SENSE}\{\cdot\}$) in lieu of the integrated gradient nonlinearity correction process for the fully-sampled data, $$u_r \approx \text{real}\{\psi^*H_{SENSE}\{(\psi_L + 2\psi_{H_1})g\}\} \quad (25);$$

where the reference phase is here estimated as, $$\psi_{i,i} = e^{j\angle(H_{SENSE}\{\psi L_g\})_i}, \quad (26).$$

Eqn, (25) reduces to standard SENSE with homodyne acquisition when $\Delta(x) = 0$ (i.e., without integrated gradient nonlinearity correction).

Figure 1:
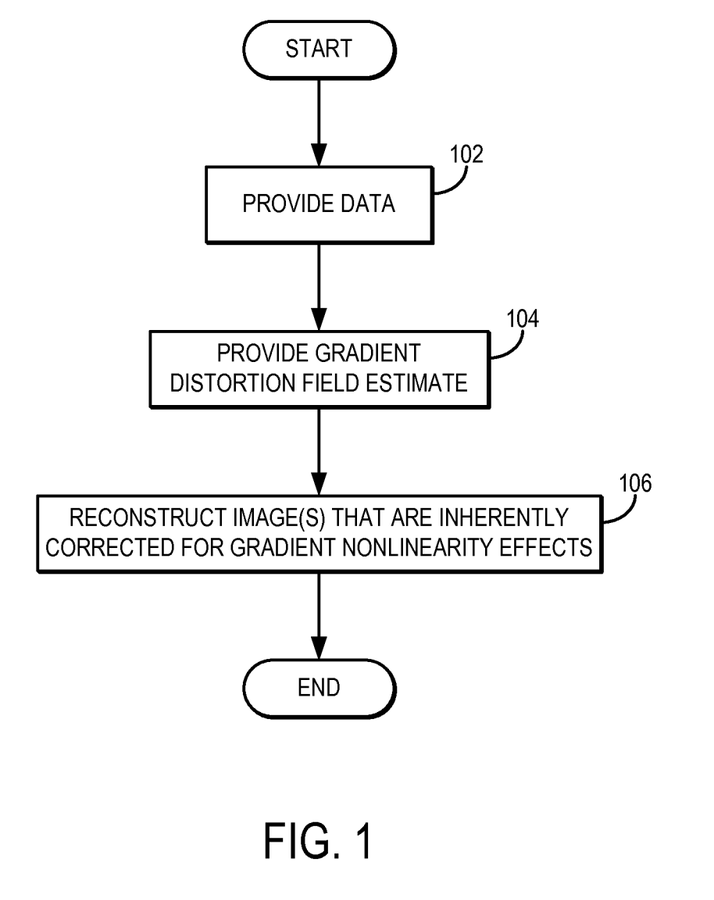
FIG. 1 is a flowchart setting forth steps for an example method for reconstructing magnetic resonance images using an integrated gradient nonlinearity and image reconstruction technique.

Referring now to FIG. 1, a flowchart is illustrated as setting forth the steps of an example of a method for reconstructing an image from magnetic resonance data using an integrated image reconstruction and gradient nonlinearity correction technique, such as those described above in detail. The method begins by providing data for reconstruction, as indicated at step 102. In some aspects, the data may be provided by acquiring the data using an MRI system using any suitable acquisition method. In some other aspects, the MRI data can be previously acquired data that is provided by retrieval from data storage. As described above, the methods of the present invention can be readily adapted for both Cartesian and non-Cartesian acquisitions (including echo planar imaging ("EPI")), whether or not undersampling is also implemented.

As part of the integrated reconstruction and gradient nonlinearity correction process, an estimate of the gradient distortion field for the MRI system is provided, as indicated at step 104. The gradient distortion field estimate can be provided by retrieving the appropriate information from the MRI system data storage, by performing an appropriate electromagnetic simulation, or by using a calibration procedure based on phantom images acquired with the MRI system.

As described above, in some embodiments the gradient distortion field can be provided from storage on an MRI scanner, or otherwise simulated using electromagnetic simulations. In other embodiments, however, the integrated image reconstruction and gradient nonlinearity correction can include an independent calibration process for estimating gradient distortions in individual scanners. As one example, MRI quality assurance phantoms with a priori known geometries are used to estimate the distortion field. Residual distortions present in images corrected using the estimated distortion field information are then iteratively minimized. This process requires no vendor-specific or proprietary information, and can thus be broadly implemented. In addition, because a gradient distortion field estimated from an imaged phantom is scanner-specific, not just model-specific, such estimations will generally be more accurate than universal models.

In one example, described below in more detail, this calibration procedure can be implemented using a quality assurance phantom, such as an Alzheimer's Disease Neuroimaging Initiative ("ADNI") phantom, and corresponding analysis software, such as AQUAL software; however, the described methodology can be readily adapted for other analogous phantoms and their associated, or otherwise appropriate, analysis software.

As indicated generally at 106, images are next reconstructed while also correcting for gradient nonlinearity effects. For instance, images are reconstructed using a model-based estimation process that provides correction for gradient nonlinearities during, rather than after, image reconstruction. In general, this process is based on a signal model that incorporates the gradient distortion field to account for the gradient nonlinearity effects, such as the signal models referenced in Eqns. (4), (6), (10), (17), or (21).

Gradient Distortion Estimation from Phantom Images

Example methods for estimating the gradient distortion field from images of phantoms are now described. In general, suppose a magnetic resonance image, x, was acquired using spatial encoding gradients whose performance is not exactly linear, as is expected by conventional MRI theory. If the N×3 coefficient set, C, for the spherical harmonic expansion of the gradient field is known, then this image could be geometrically corrected using standard gradient nonlinear correction techniques; that is, a corrected image, $x_{corrected}$, can be produced as, $$x_{corrected} = F\{x,C\} \qquad (27).$$

MRI scanner vendors commonly perform corrections of this type for all images that they display; however, the coefficient matrix, C, is generally treated as proprietary information and may not be available to the public for general use. Typically, MRI vendors estimate the coefficient matrix, C, for a specific magnet model via electromagnetic ("EM") simulation, and use this matrix for all scanner models of a given type. In practice, however, differences in magnetic coil winding, scanner and other factors can cause the true or ideal coefficients, C, to vary across scanners of the same type. Based on the factors mentioned above, there is motivation to develop a gradient distortion estimation strategy that can independently calibrate any individual MRI scanner without needing the proprietary coefficient matrix information.

Now, suppose x represents an image of a phantom object with a priori known geometry, such as the ADNI phantom, and that there exists an operator, A{•}, that identifies the spatial position of M markers within the image, x; namely, $$P = A\{x\} \qquad (28);$$

where P is an M×3 matrix. Additionally, let $P_0$ be an M×3 matrix representing the expected true position of the markers. The spatial distortion of an image due to gradient nonlinearity can then be summarized by the mean square error ("MSE") of measured versus actual marker positions; that is, $$MSE(x) = \|A\{x\} - P_0\|_F^2 \qquad (29).$$

Similarly, the spatial distortion MSE of a corrected image is, $$MSE(x,C) = \|A\{F\{x,C\}\} - P_0\|_F^2 \qquad (30).$$

Presuming that the distorted image, x, is fixed, the gradient distortion field can be estimated by finding the spherical harmonic basis coefficients, C, that minimize the above MSE quantity; namely, $$[\hat{C}] = \underset{C}{\mathrm{argmin}}\{\|A\{F\{x,C\}\} - P_0\|_F^2\}. \qquad (31)$$

This estimation process can be carried out using any number of suitable numerical optimization routines, two examples of which are now described.

Presuming that the image, x, is known, the following affine function can be defined:

$$H\{•\} = A\{F\{x,•\}\} - P_0 \qquad (32);$$

Additionally, suppose that a guess about the coefficient $C_{prior}$, is known or can otherwise be reasonably selected. Setting $C = C_{prior} + \Delta C$, Eqn. (31) can be equivalently expressed as, $$[\Delta \hat{C}] = \underset{\Delta C}{\mathrm{argmin}}\{\|H\{C_{prior} + \Delta C\}\|_F^2\}. \qquad (33)$$

Because H{•} is nonlinear and possibly not defined by a closed-form mathematical expression, a Gauss-Newton optimization strategy can be used for solving Eqn. (33). This approach includes a linear approximation of H{•}, which can be achieved using a first-order Taylor expansion; namely, $$H\{C_{prior} + \Delta C\} \approx H\{C_{prior}\} + J_H\{C_{prior}\} \odot \Delta C \qquad (34);$$

where $J_H\{•\}$ denotes the rank-4 Jacobian tensor for H{•} and the "⊙" is the multilinear inner product operator. Specifically, $$[J_H\{X\}]_{(m,n),(p,q)} = \left.\frac{\partial [H\{X'\}]_{(m,n)}}{\partial [X']_{(p,q)}}\right|_{X'=X}; \qquad (35)$$

and $$[J_H\{X\} \odot Y]_{(m,n)} = \sum_{p,q} [J_H\{X\}]_{(m,n),(p,q)} [Y]_{(p,q)}. \qquad (36)$$

Based on these definitions, the Gauss-Newton algorithm for solving Eqn. (33) can be generalized by the following steps:

---
Algorithm 1: Gauss-Newton Iteration for
Gradient Distortion Estimation
---
INPUT: x, $C_0$, maxIter
for t = 1:maxIter $$\Delta C_{t+1} = \underset{\Delta C}{\operatorname{argmin}} \|H\{C_t\} + J_H\{C_t\} \odot \Delta C\|_F^2$$

$C_{t+1} = C_t + \Delta C_{t+1}$
end

---

Even though the preceding algorithm represents a logical strategy for performing gradient distortion estimation, determining and evaluating the rank-4 Jacobian of the spatial distortion function, $H\{\bullet\}$, can be generally impractical or infeasible. Consequently, an approximate Gauss-Newton algorithm that replaces the Jacobian operator with a suitable, lower-dimensional approximation can be implemented. The functional behavior of the spatial distortion function is roughly, $$H\{0\} - H\{C\} \approx S_0 C \qquad (37);$$

where the M×P matrix, $S_0$, is the spherical harmonic basis evaluated at the true marker spatial positions, $P_0$. That is, Eqn. (37) means that the difference between marker positions in an uncorrected image and corrected image is determined only by the distortion field. In practice, other factors such as the specific correction strategy used, and variations in the analysis software, will also impact this quantity. But, these factors can be ignored while still achieving a reasonable approximation. It should be appreciated by those skilled in the art that other approximations similar to Eqn. (37) may also be viable. From Eqn. (34), it then follows that, $$J_H\{C\} \odot \Delta C \approx -S_0 \Delta C \qquad (38).$$

Consequently, the first step of Algorithm 1 resorts to, $$\Delta C_{t+1} = \underset{\Delta C}{\operatorname{argmin}} \|H\{C_t\} - S_0 \Delta C\|_F^2 = S_0^{\dagger} H\{C_t\}; \qquad (39)$$

where the superscript "†" denotes the (left) pseudo-inverse. Following from Eqn. (39), Algorithm 1 subsequently transforms to:

---
Algorithm 2: Approximate Gauss-Newton Iteration
for Gradient Distortion Estimation
---
INPUT: x, $C_0$, maxIter
for t = 1 :maxIter
  $C_{t+1} = C_t + S_0^{\dagger} H\{C_t\}$
end

---

This fast approximation algorithm is very straightforward to implement and execute. Moreover, given the generally small column size of $S_0$, matrix pseudo-inverses can also be calculated using direct methods.

An example of estimating a gradient distortion field based on images of a quality assurance phantom is now described. The ADNI quality assurance phantom is a popular tool for estimating residual geometric distortion in post-correction MR images. Software, such as AQUAL, is also available for estimating the nominal versus actual position of phantom fiducial markers. The ADNI phantom can be imaged and an image volume initially reconstructed without any on-scanner gradient nonlinearity correction, yielding geometrically distorted results (see first column of FIG. 2).

Figure 2:
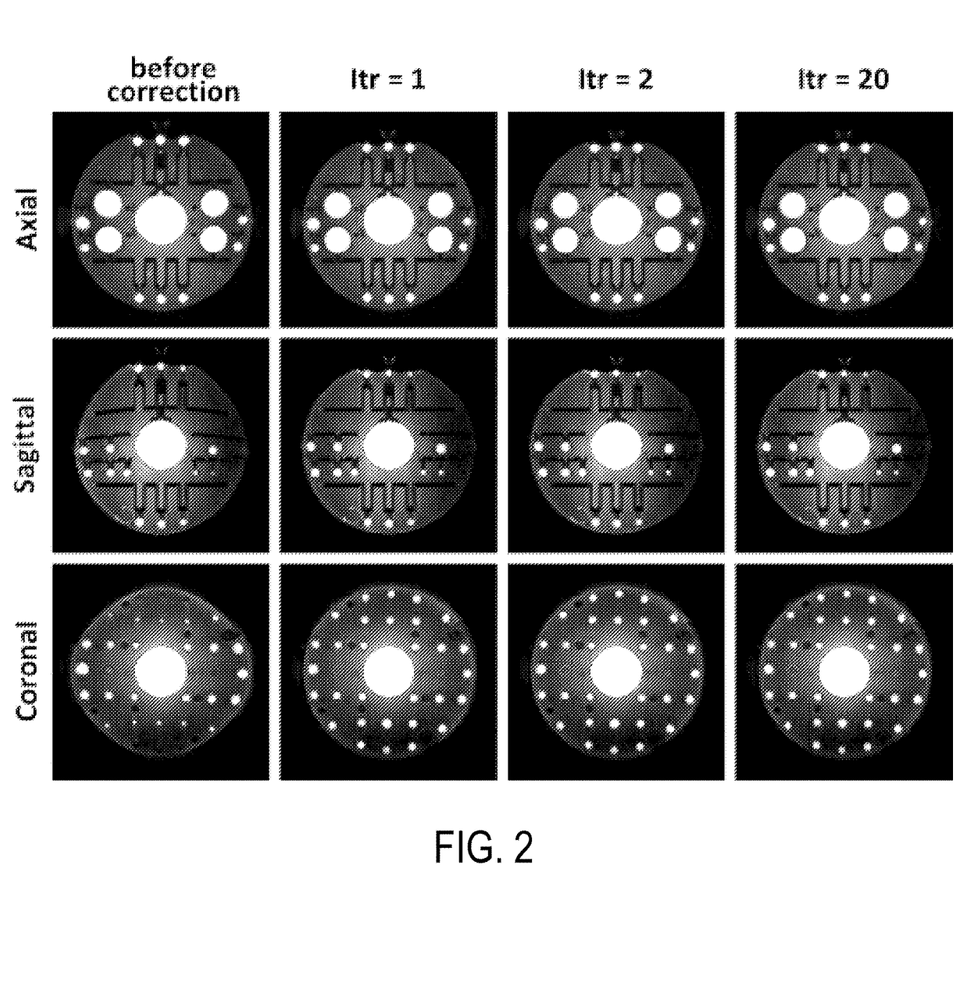
FIG. 2 depicts full scale images of an ADNI phantom before gradient nonlinearity correction, and post-correction using coefficient matrices generated (at different iterations) by the proposed iterative scheme.

Given an initial distorted image, x, of the ADNI phantom and fiducial marker positions, $P_0$ (e.g., from the AQUAL software), the calibration procedure described above was run for 25 iterations. The algorithm was initialized at C=0, such that no vendor proprietary information was used at any stage of the estimation process. For all intermediary estimates of C, gradient nonlinearity correction was performed via in age-domain cubic spline interpolation.

As demonstrated in FIG. 2, the proposed calibration strategy effectively estimates gradient distortions present in this data—with no outside information—and enables it to be successfully corrected for in the images.

Figure 3:
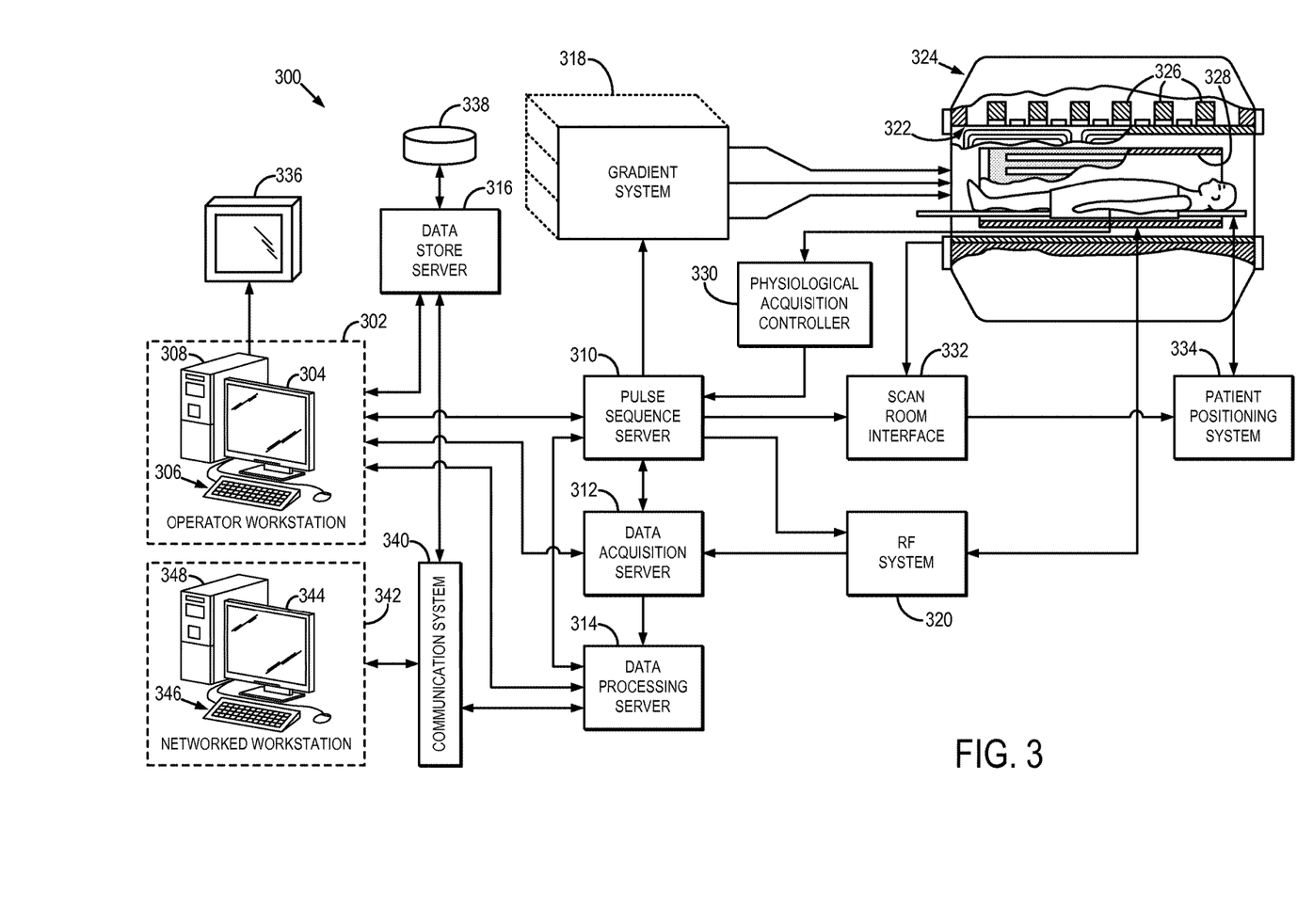
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RE transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad (40);$$

and the phase of the received magnetic resonance signal may also be determined according to the following relationship:

$$\varphi = \tan^{-1}\left(\frac{Q}{I}\right). \qquad (41)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3) from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing an image of a subject while correcting for gradient nonlinearity effects using a magnetic resonance imaging ("MRI") system, the steps of the method comprising:
   (a) providing magnetic resonance data acquired from a subject using an MRI system;
   (b) providing an estimate of a gradient distortion field associated with the MRI system;
   (c) reconstructing at least one image of the subject from the magnetic resonance data while correcting for errors associated with a gradient nonlinearity using a model-based estimation that incorporates the estimate of the gradient distortion field into a magnetic resonance signal model to account for the errors associated with the gradient nonlinearity, thereby simultaneously reconstructing the at least one image of the subject and correcting the at least one image for the errors associated with the gradient nonlinearity.

2. The method as recited in claim 1, wherein the estimate of the gradient distortion field is estimated from at least one image of a phantom having known geometrical information.

3. The method as recited in claim 2, wherein the phantom is a quality assurance phantom having markers located at known positions.

4. The method as recited in claim 3, wherein the gradient distortion field is estimated based on a displacement of the markers from the known positions.

5. The method as recited in claim 1, wherein the model-based estimation implements an iterative optimization.

6. The method as recited in claim 1, wherein the model-based estimation implements a non-iterative optimization.

7. The method as recited in claim 1, wherein the magnetic resonance data are acquired using Cartesian sampling.

8. The method as recited in claim 7, wherein step (b) implements a type-I non-uniform fast Fourier transform that accounts for the gradient nonlinearity.

9. The method as recited in claim 1, wherein the magnetic resonance data are acquired using a partial Fourier homodyne acquisition.

10. The method as recited in claim 1, wherein the magnetic resonance data are undersampled magnetic resonance data acquired using a multichannel receive coil array.

11. The method as recited in claim 1, wherein the magnetic resonance data are acquired using non-Cartesian sampling.

12. The method as recited in claim 11, wherein step (b) implements a type-III non-uniform fast Fourier transform that accounts for the gradient nonlinearity.

* * * * *

UNITED STATES PATENT AND TRADEMARK OFFICE
CERTIFICATE OF CORRECTION

PATENT NO. : 10,302,731 B2
APPLICATION NO. : 15/305443
DATED : May 28, 2019
INVENTOR(S) : Joshua D. Trzasko et al.

It is certified that error appears in the above-identified patent and that said Letters Patent is hereby corrected as shown below:

In the Specification

Column 2, Line 63, "NM" should be --MRI--.

Column 5, Line 53, Eq. (11), " $u_r = real\left[\psi^*\left(A^*A\right)^{-1}A^*g\right]$ " should be
-- $u_r = real\left\{\psi^*\left(A^*A\right)^{-1}A^*g\right\}$ --.

Column 6, Line 25, Eq. (16), " $\psi_{i,i} = e^{j\angle\left(diag\{J\}A^*\psi_L g\right)_t}$ " should be
-- $\psi_{i,i} = e^{j\angle\left(diag\{J\}A^*\Phi_L g\right)_t}$ --.

Column 8, Line 12, Eq. (23), " $v = \left[\hat{S}^*\left(I \otimes F^*\psi^*\psi F\right)\hat{S} + \mu 1\right]^{-1}\hat{S}^*\left(I \otimes F^*\psi^*\right)g$ "
should be -- $v = \left[\hat{S}^*\left(I \otimes F^*\Phi^*\Phi F\right)\hat{S} + \mu 1\right]^{-1}\hat{S}^*\left(I \otimes F^*\Phi^*\right)g$ --.

Column 8, Line 42, Eq. (25), " $u_r \approx real\left\{\psi^* H_{SENSE}\left\{\left(\psi_L + 2\psi_{H_1}\right)g\right\}\right\}$ " should be Signed and Sealed this
Seventeenth Day of September, 2019

Andrei Iancu
*Director of the United States Patent and Trademark Office*

CERTIFICATE OF CORRECTION (continued)
U.S. Pat. No. 10,302,731 B2

$$u_r \approx real\left\{\psi^* H_{SENSE}\left\{\left(\Phi_L + 2\Phi_{H_1}\right)g\right\}\right\}$$ --.

Column 8, Line 45, Eq. (26), "$\psi_{i,i} = e^{j\angle(H_{SENSE}\{\psi_L g\})_i}$" should be --$\psi_{i,i} = e^{j\angle(H_{SENSE}\{\Phi_L g\})_i}$--.

Column 9, Line 64, "scanner and" should be --scanner siting, and--.

Column 10, Line 17, Eq. (29), "$MSE(\mathrm{x}) = \|A\{x\} - P_0\|_F^2$" should be --$MSE(\mathrm{x}) = \|A\{x\} - P_0\|_F^2$--.

Column 10, Line 20, Eq. (30), "$MSE(x,\mathrm{C}) = \|A\{F\{x,C\}\} - P_0\|_F^2$" should be --$MSE(x,\mathrm{C}) = \|A\{F\{x,C\}\} - P_0\|_F^2$--.

Column 10, Lines 38-39, "coefficient $C_{prior}$" should be --coefficient matrix, $C_{prior}$--.

Column 12, Line 11, "via in age-domain" should be --via image-domain--.

Column 12, Line 56, "an RE transmitter" should be --an RF transmitter--.